(12) United States Patent
Grabill et al.

(10) Patent No.: US 7,193,435 B2
(45) Date of Patent: Mar. 20, 2007

(54) PROGRAMMABLE APPLICATION SPECIFIC INTEGRATED CIRCUIT FOR COMMUNICATION AND OTHER APPLICATIONS

(75) Inventors: James Garland Grabill, Fort Wayne, IN (US); Rodney Louis Wilson, Churubusco, IN (US); Mark Alan Norden, Fort Wayne, IN (US); Thomas Robertson Dickson, II, Warren, IN (US); Bruce Edward Reidenbach, Albion, IN (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 204 days.

(21) Appl. No.: 11/049,947

(22) Filed: Feb. 4, 2005

(65) Prior Publication Data

US 2006/0176077 A1  Aug. 10, 2006

(51) Int. Cl.
*H03K 19/177* (2006.01)

(52) U.S. Cl. .......................................... 326/39; 326/38
(58) Field of Classification Search .................. 326/38, 326/39, 41
See application file for complete search history.

(56) References Cited

U.S. PATENT DOCUMENTS

| | | | |
|---|---|---|---|
| 5,068,823 A | 11/1991 | Robinson | |
| 5,687,325 A | 11/1997 | Chang | |
| 5,874,834 A * | 2/1999 | New | 326/39 |
| 6,072,994 A | 6/2000 | Phillips et al. | |
| 6,546,261 B1 | 4/2003 | Cummings | |
| 6,724,220 B1 | 4/2004 | Snyder et al. | |
| 6,781,408 B1 * | 8/2004 | Langhammer | 326/41 |
| 7,073,158 B2 * | 7/2006 | McCubbrey | 716/17 |
| 2002/0082044 A1 | 6/2002 | Davenport | |
| 2003/0050055 A1 | 3/2003 | Ting et al. | |
| 2003/0062922 A1 * | 4/2003 | Douglass et al. | 326/39 |
| 2003/0154357 A1 | 8/2003 | Master et al. | |
| 2003/0158954 A1 | 8/2003 | Williams | |
| 2003/0216927 A1 | 11/2003 | Sridhar et al. | |
| 2004/0029575 A1 | 2/2004 | Mehta | |

(Continued)

FOREIGN PATENT DOCUMENTS

GB    2 350 749 A    12/2000

(Continued)

OTHER PUBLICATIONS

Yang, X. et al.; "Fast Subword Permutation Instructions Using Omega and Flip Network Stages"; Proceedings of SPIE Media Processors 2000, Jan. 2000; 8 pages.

(Continued)

*Primary Examiner*—Vibol Tan
(74) *Attorney, Agent, or Firm*—Edell, Shapiro & Finnan, LLC (57) ABSTRACT

A programmable application specific integrated circuit (ASIC) for implementing operations that involve a plurality of computational functions. The programmable ASIC comprises a plurality of fixed functions and programmable switch logic. Each of the plurality of fixed functions is parameterized such that its operational characteristics are programmable using different operating parameters. In addition, each of the plurality of fixed functions inputs and outputs data in accordance with common interface rules. The programmable switch logic is configurable to link two or more of the fixed functions in a sequence to perform desired operations. The fixed functions are implemented using "hard" or fixed digital logic gates such as those in an ASIC.

35 Claims, 7 Drawing Sheets

U.S. PATENT DOCUMENTS

| | | |
|---|---|---|
| 2004/0063425 A1 | 4/2004 | Wakutsu et al. |
| 2004/0093589 A1 | 5/2004 | Master |
| 2004/0127202 A1 | 7/2004 | Shih et al. |
| 2005/0059427 A1* | 3/2005 | Wallace .................. 455/552.1 |

FOREIGN PATENT DOCUMENTS

| | | |
|---|---|---|
| WO | WO 00/68698 A1 | 11/2000 |
| WO | WO 03/017706 A1 | 2/2003 |
| WO | WO 03/028228 A2 | 4/2003 |

OTHER PUBLICATIONS

Pedersen, R. et al.; "An FPGA Implementation of Bene Permutation Networks"; Technical Report DU-CS-03-06, Department of Computer Science, Drexel University, 2003; 13 pages, no month.

* cited by examiner

PROGRAMMABLE APPLICATION SPECIFIC INTEGRATED CIRCUIT FOR COMMUNICATION AND OTHER APPLICATIONS

BACKGROUND OF THE INVENTION

This invention relates to programmable application specific integrated circuits (ASICs) useful for a variety of data processing applications including communication applications.

Communication devices such as cellular telephone handsets, cordless telephones, wireless local area network (WLAN) client stations, and other wired and wireless radio communication devices, require signal processing according to one of a variety of open or proprietary communication standards or protocols. Due to the numerous communication protocols, variations and improvements thereto, being developed, efforts have been made to develop what is referred to as a software defined radio (SDR) device.

The concept behind the SDR device is the ability to reprogram and reconfigure a device with capabilities, such as a new or modified communication protocol, while in an operational environment. These capabilities are also referred to as "waveforms" and include digital signal processing functions, networking protocols, and other algorithms required for communication in accordance with a defined standard.

The modem processing portion of a modern radio device typically includes either one or more field programmable gate array (FPGA(s)) or one or more ASIC device(s) to host the digital signal processing (DSP) functions for the communication standard(s) supported by the device. These DSP functions tend to be very processing intensive and/or have time-critical execution constraints.

FPGA devices are generally used in SDR designs where waveform reprogrammability and reconfigurability, and waveform "download" objectives are important. In this case, when the operator selects a given waveform as his communications media, the radio system loads the FPGA with the necessary DSP algorithms to operate the selected waveform. Likewise, when the operator selects another waveform as the communications medium (i.e., reprograms and re-configures the radio channel), the radio system reloads the FPGA with a different set of DSP algorithms required to operate the newly-selected waveform. The reprogrammability aspects of the FPGA also supports waveform "downloads", which involves incorporating changes to existing waveforms and adding new waveforms as they become available.

ASIC devices are generally used in radio applications where re-programmability is not required. In this case, ASIC devices are generally built for one specific waveform, or to host well-defined DSP algorithms that may not be practical to implement in an FPGA.

Use of an FPGA in an SDR device has 3 major shortcomings: (1) very high power consumption; (2) large component size due to large silicon area, and (3) high component cost. First, for high speed and performance related designs the FPGA consumes a large amount of power, which is problematic in SDR designs, particularly for battery-operated devices or equipment. To illustrate, for a given waveform design, an FGPA implementation of that design would consume approximately 5 to 10 times the power consumed by a similar design implemented with an ASIC. The relatively high power consumption of the FPGA results in lower battery life for portable radio devices, and significantly complicates the thermal management aspects of the device design.

Second, from a size standpoint, FPGA devices tend to be relatively large devices. Again, for a given waveform, an FGPA sized to support that waveform may be 5 to 10 times the size of an ASIC implementation. This relatively large size negatively impacts the drive towards reducing the size of portable radio devices that are programmable.

Third, from a hardware component standpoint, the unit cost of the FPGA device may be 10 to 20 times that of an ASIC, which drives the overall cost of the radio equipment.

Use of the traditional ASIC devices in low-power, programmable SDR devices also has its disadvantages: (1) inability to be reprogrammed in an operational environment; (2) inability to support the large number of waveforms (e.g., 20-40) needed; and (3) cannot be augmented or enhanced after product introduction for new waveforms.

First, traditional ASIC devices contain waveform functions hard cast in silicon. As such, this type of device is not reprogrammable in an operational environment.

Second, ASIC devices are generally built for one specific waveform, (or to host well-defined DSP algorithms that may not be practical to implement in an FPGA). Therefore, hosting 20–40 different waveforms in one SDR device would require including 20–40 traditional ASIC devices in the device (generally, one per waveform). In this configuration, when the operator selects a waveform, the radio system would "switch in" the ASIC specific to the selected waveform and the other 19–39 ASICs would be "switched out". This is a relatively impractical from the standpoint of resource optimization and physical size.

Third, traditional ASICs do not have the ability to be reloaded with new waveforms or new DSP algorithms. Once the radio device is built using traditional ASICs, any enhancements, modifications, or added functionality are not possible without replacing the ASIC device. Replacing the ASIC device is neither practical nor cost effective, especially once the device is fielded.

What is needed is a data processing environment that is reconfigurable after deployed in the field, and may be suitable for portable device applications that are constrained by power consumption limitations.

SUMMARY OF THE INVENTION

Briefly, a programmable ASIC is provided for implementing operations that involve a plurality of computational functions. The programmable ASIC comprises a plurality of fixed functions and programmable switch logic. Each of the plurality of fixed functions is parameterized such that its operational characteristics are programmable using different operating parameters. In addition, each of the plurality of fixed functions inputs and outputs data in accordance with common interface rules. The programmable switch logic is configurable to link two or more of the fixed functions in a sequence to perform desired operations. The fixed functions are implemented using "hard" or fixed digital logic gates such as those in an ASIC.

One application of the programmable ASIC is (wired or wireless) communication. For example, the programmable ASIC may configured for one or more of a plurality of waveforms. The parameters for each of a plurality of fixed functions are configured according to the one or more waveforms that the programmable ASIC is to support. A plurality of programmable functions may optionally be deployed on the programmable ASIC and programmed according to the one or more waveforms that the programmable ASIC is to execute.

DETAILED DESCRIPTION

Figure 1:
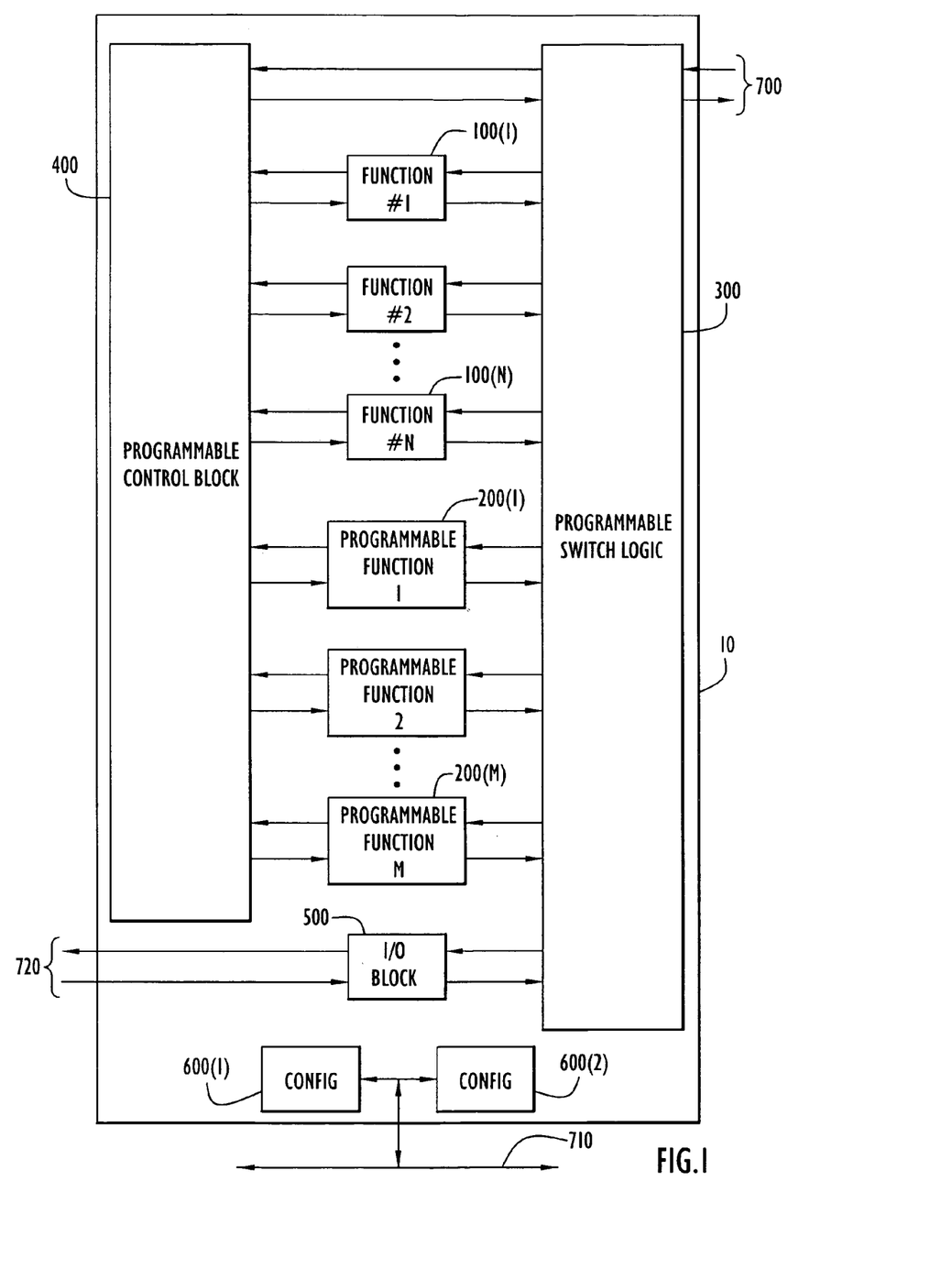
FIG. 1 is a functional block diagram of a programmable ASIC.

Referring first to FIG. 1, a functional block diagram for a programmable application specific integrated circuit (ASIC) is shown at 10. The programmable ASIC 10 comprises a plurality of fixed function blocks 100(1) to 100(N), a plurality of programmable function blocks 200(1) to 200(M) and programmable switch logic 300. In addition, there is a programmable control block 400, an input/output (I/O) block 500, configuration blocks 600(1) and 600(2), a data interface 700 a bus interface 710 and data converter interfaces 720. The programmable function blocks 200(1) to 200(M) are optional. For some applications, they are not necessary and the desired functionality can be achieved using a plurality of fixed function blocks configured with the appropriate parameters, as described below.

Each of the fixed function blocks 100(1) to 100(N) and programmable function blocks 200(1) to 200(N) connects bi-directionally to the programmable switch logic 300 and to the programmable control block 400. In addition, the programmable control block 400 connects bi-directionally to the programmable switch logic 300.

The fixed functions blocks 100(1) to 100(N) are a set of common signal processing (processing path) functions that are parameterized and implemented as "hard", e.g., fixed digital logic gates, in the programmable ASIC 10. Each of the fixed function blocks 100(1) to 100(N) is parameterized such that its operational characteristics can be programmed using different operating parameters. This is convenient because many signal processing functions tend to be common across a variety of applications (such as a variety of communication protocols or waveforms), whereby certain operating parameters (characteristics) of those function may be different depending on the application. By making the functions parameterized, the operational characteristics of any given function may be programmed for a specific application (e.g., communication standard or waveform).

Examples of the fixed functions (applicable to a communication application) that may be parameterized include:

Finite Input Response (FIR) Filter Bank
Frequency Excision
Fast Fourier Transform/Inverse Fast Fourier Transform (FFT/IFFT)
Convolutional Encoding/Decoding
Walsh Encoding/Decoding
Interleaving/De-interleaving
Digital Matched Filters
Digital Quad Mixer
Automatic Gain Control
RAKE Receiver
Transmission Security (TRANSEC) generation
Phase Locked Loop Clock Generation.

In addition, each parameterized fixed function 100(1) to 100(N) provides a common interface in which to pass data from one function to another via the programmable switch logic 300. As a result, the programmable switch logic 300 can connect the fixed function blocks together in any order. Each function block contains circuitry that controls semaphores on the common data interface to indicate the validity of output data and the need for additional input data. As each function is responsible for maintaining data flow through its own block, the data naturally flows through at a maximal rate, dependent only upon the data rate of the source and destination function blocks connected to it. The common data interface format is described further hereinafter in conjunction with FIGS. 3 and 4.

The programmable functions 200(1) to 200(M) provide the ability to add signal processing functions that have not been incorporated as "hard" functions for whatever reason. The programmable functions 200(1) to 200(M) may be implemented using one or more "small" FPGA cores within the ASIC and/or emerging technologies such as reconfigurable computing fabrics or logic. This provides the ability to easily add new or modified signal processing functions if needed after ASIC development and product fielding. An example of a reconfigurable computing fabric or logic technology is D-Fabrix™ technology developed and marketed by Elixent, Ltd.

The programmable switch logic 300 links together one or more of the fixed functions 100(1) to 100(N) and programmable functions 200(1) to 200(M) in any combination required. As mentioned above, since all signal processing interfaces are identical, the programmable switch logic can connect one or more of the functions 100(1) to 100(N) and 200(1) to 200(M) together in any order. The programmable switch logic 300 is essentially multiplexer logic to interconnect the functions. For example, known switch matrix technology, such as a recursive permutation matrix, is suitable for this function. An example of recursive permutation matrix technology is described in "An FPGA Implementation of Benes Permutation Networks," Richard N. Pedersen et al., Technical Report DU-CS-03-06, Department of Computer Science, Drexel University, 2003, and "Fast Subword Permutation Instructions Using Omega and Flip Network Stages," Xiao Yang et al., Proceedings of SPIE Media Processors 2000, pp. 80–86, January 2000. These papers are incorporated herein by reference. The programmable switch logic 300 may be implemented in fixed digital logic gates or an FPGA that can be controlled to select a desired path through the matrix.

The programmable control block 400 supports real-time processing control, such as state machines. Since real-time control functions are typically small compared to the signal processing function blocks themselves, this block may be implemented using a "small" FPGA core in the range of 2000 to 5000 flip-flop/logic elements, for example.

The I/O block 500 supports the necessary interfaces to peripheral functions that vary depending on the application.

Examples of such peripheral functions are analog-to-digital converters (ADCs) and digital-to-analog converters (DACs).

The configuration blocks 600(1) and 600(2) store parameters needed to configure the fixed functions 100(1) to 100(N) for a particular application, e.g., to process a particular waveform. The configuration blocks may be implemented in an FPGA.

The data interface 700 supports movement of data between the ASIC 10 and a host processor such as a general purpose processor (GPP) or a digital signal processor (DSP).

The bus interface 710 supports configuration, control and status of the programmable ASIC 10.

This programmable ASIC 10 combines the low power and small size benefits offered by ASIC technology with the ability to personalize/customize functionality, via parameter settings, as is traditionally provided with FPGA technologies. The result is a programmable ASIC device that consumes much less power than an FPGA, is capable of hosting a variety of signal processing functions such as those used by an SDR device, and offers a degree of re-configurability to support future updates and additions. It may be used for any data processing application.

The programmable ASIC 10 overcomes the shortcomings of FPGA devices by incorporating some of the processing-intensive DSP algorithms, normally hosted on the FPGA, as parameterized functions hard cast in silicon, i.e., fixed digital logic gates. This results in power consumption that would be near that provided by an ASIC design. The programmable ASIC 10 also overcomes the disadvantages of an ASIC by the parameterization of the "hard" functions in the ASIC, coupled with the inclusion of programmable or reconfigurable functions that also may be referred to as intellectual property (IP) cores.

One application of the programmable ASIC is wired or wireless communication devices and equipment. For example, the programmable ASIC may configured for modem and/or radio frequency (RF) signal processing associated with one or more of a plurality of waveforms. The parameters for each of a plurality of fixed function blocks 100(1) to 100(N) are configured according to the particular waveform to be processed. Likewise, the programmable function blocks 200(1) to 200(N) are programmed according to the particular waveform to be processed. The programmable switch logic 300 combines the plurality of fixed functions and the plurality of programmable function blocks 200(1) to 200(N) in a desired manner to achieve signal processing of one or more of the plurality of waveforms. The programmable ASIC may perform RF signal processing functions as well.

The term waveform is meant to denote a baseband, intermediate frequency and/or RF signal formatted according to any proprietary or public communication protocol, standard or format now known or hereinafter developed. For example, the waveform for an IEEE 802.11 WLAN communication standard is different than the waveform for the Bluetooth™ communication protocol. However, many basic functions used to modulate or demodulate an IEEE 802.11 WLAN signal may also used for a Bluetooth signal. If the programmable ASIC is to support both of these waveforms, the functions that are common between them are implemented using fixed function blocks, and the functions that are not common are implemented using programmable function blocks. There are parameters for the common functions that will necessarily be different between the two waveforms. The fixed function blocks for these common functions are configured with the appropriate parameters when the programmable ASIC is to process that waveform. Likewise, the programmable function blocks are programmed with the appropriate algorithm or computation to process that waveform. The programmable ASIC may support one or both waveforms at the same time, depending on a desired market or application. In generally, the programmable ASIC may be designed to process two or more waveforms at the same time, or in a time-multiplexed fashion.

Figure 2:
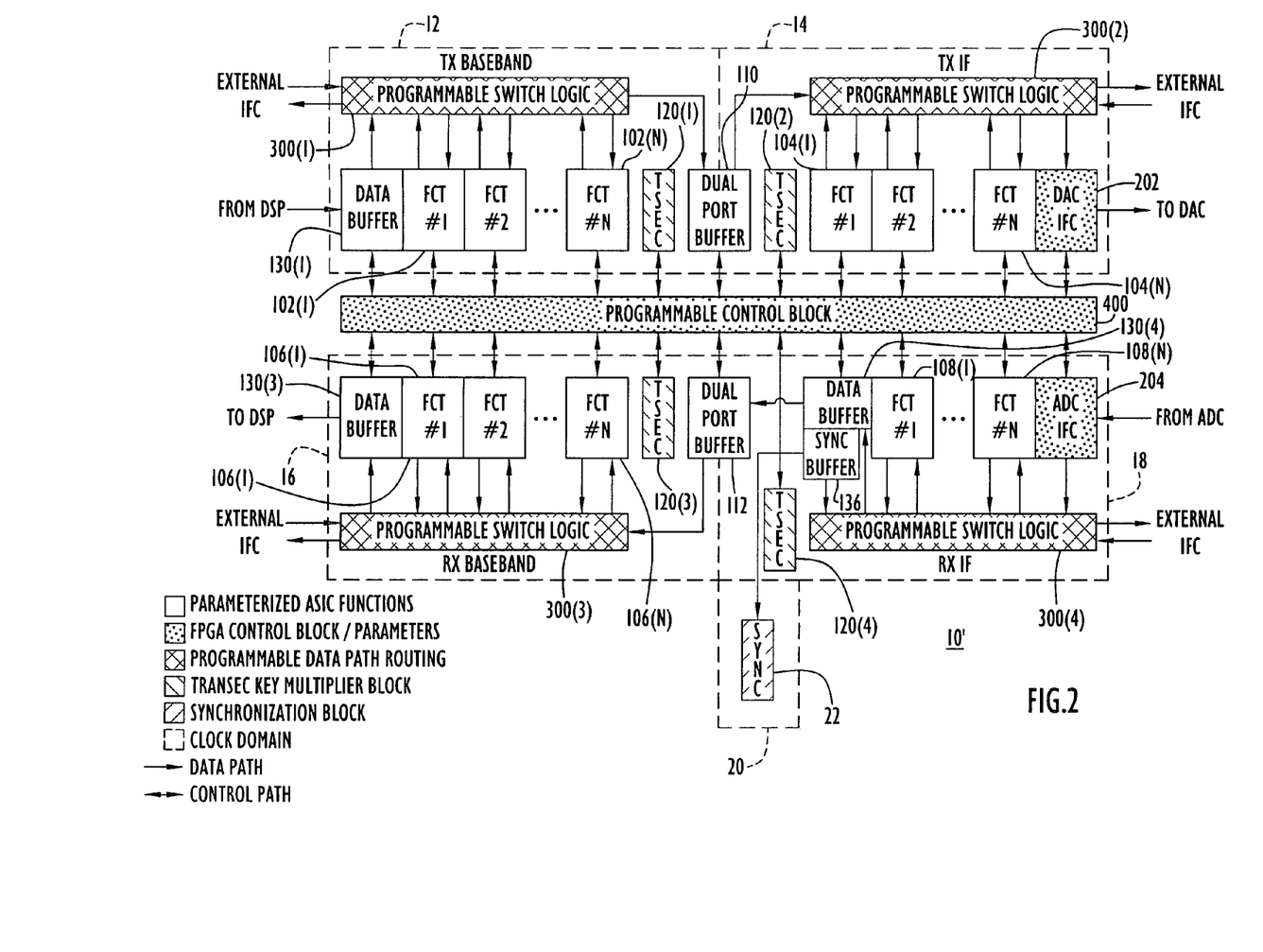
FIG. 2 is a functional block diagram of a programmable ASIC for a radio communication application.

Turning to FIG. 2, a specific example of the programmable ASIC is shown at reference numeral 10'. In this example, the programmable ASIC 10' is architected for a radio communication modem application and consequently provides processing functions for both transmit (TX) and receive (RX) processing paths of a modem. These processing paths are broken down into smaller data processing functions that can be connected together in a flexible manner to implement a wide range of waveforms. For this example, the programmable ASIC 10' performs both baseband and intermediate frequency (IF) signal processing.

Since the intermediate frequency (IF) and baseband data processing functions are typically unrelated, the transmit and receive processing paths are further broken down between IF and baseband processing paths, resulting in 4 main processing engines or paths. This results in smaller and more manageable switching logic, as well as providing the capability of running the IF and baseband logic at independent clock frequencies to optimize power consumption. The programmable switch logic links the fixed functions to perform transmit baseband processing in a transmit baseband processing path, transmit intermediate frequency (IF) processing in a transmit IF processing path, receive IF processing in a receive IF processing path and receive baseband processing in a receive baseband processing path.

Thus, there is a TX baseband clock domain or processing path 12, a TX IF path 14, a RX baseband path 16 and a RX IF path 18. The programmable control block 300 connects to and controls each of these paths. A dual port buffer memory (a fixed function block) 110 is shared between the TX baseband path 12 and the TX IF path 14, and a dual port buffer memory 112 is shared between the RX baseband path 16 and the RX IF path 18.

The TX baseband path 12 comprises programmable switch logic 300(1), a plurality of fixed function blocks 102(1) to 102(N), and a transmission security (TRANSEC) block 120(1). The fixed function blocks 102(1) to 102(N) are parameterized ASIC function blocks necessary for the TX baseband signal processing functions. In addition, there is an input data buffer (BFR) block 130(1) that is implemented as a fixed function block.

The TX IF path 14 comprises programmable switch logic 300(2), a plurality of fixed function blocks 104(1) to 104(N), a TRANSEC block 120(2), a data buffer block 130(2) and a DAC interface (IFC) block 202. The fixed function blocks 104(1) to 104(N) are parameterized ASIC function blocks necessary for the TX IF processing functions. The DAC IFC block 202 is a programmable function that is implemented in an FPGA or with reconfigurable computing logic, and manages interfacing of digital transmit data to a DAC.

The RX baseband path 16 comprises programmable switch logic 300(3), a plurality of fixed function blocks 106(1) to 106(N), a data buffer block 130(3) and a TRANSEC block 120(3). The fixed function blocks 106(1) to 106(N) are parameterized ASIC function blocks necessary for the RX baseband signal processing functions.

The RX IF path 18 comprises programmable switch logic 300(4), a plurality of fixed function blocks 108(1) to 108(N), a TRANSEC block 120(4), a data buffer block 130(4), a synchronization (sync) buffer block 136 and a ADC IFC block 204. The fixed function blocks 108(1) to 108(N) are parameterized ASIC function blocks necessary for the RX IF processing functions. The ADC IFC block 204 is a programmable function that is implemented in an FPGA or a reconfigurable computing fabric, and manages interfacing of digital from an ADC.

The processing functions for the sync path 20 are contained in its own clock domain. The sync path 20 comprises a sync block 22. Since the sync input comes from the RX IF path 18, the baseband path can be turned off until waveform synchronization is achieved. When sync is detected, the programmable control block 400 uses the sync timestamp to determine the beginning of the RX data contained in the data buffer 130(4). The programmable control block 400 transfers the RX data from the data buffer 130(4) to the dual-port buffer 112 between the RX IF and RX baseband clock sections until the reception is complete. The purpose of the timestamp methodology is to eliminate all ambiguity due to multiple clock domain crossings.

Each of the processing paths 12, 14, 16 and 18 has an independent clock domain. The rate of each clock is programmable depending on the waveform being processed. The programmable control block 400 can individually disable each clock. By separating the clock domains, power savings can be achieved by setting each domain to the minimum frequency required for that domain, as well as turning clocks off when not transmitting or receiving. Because all clock domains are potentially asynchronous to one another, the dual port buffers 110 and 112 are used when passing data from one clock domain to another. The dual port buffers 110 and 112 also adhere to the common data interface rules described below.

According to one aspect of the programmable ASIC described herein, all data processing functions (fixed and programmable) adhere to a set of common data interface rules to pass data from one function to another. This allows for data to flow from any function block to another function block. The programmable switch logic passes data between the plurality of fixed functions according to the common interface rules thereby allowing linking of the fixed functions in any order It is the responsibility of each data function to request, process, and output data as fast as it can (as fast as requirements dictate). Every data function will "automatically" adjust to any data rate, given a fast enough master clock (processing clock). This is analogous to a DSP/Microprocessor clock rate.

Figure 3:
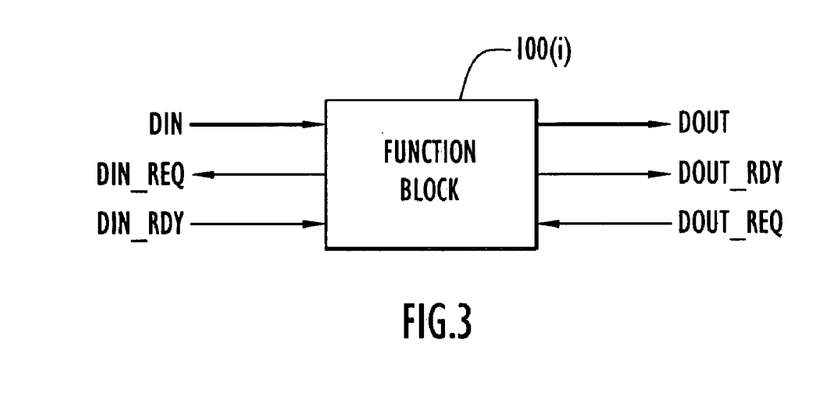
FIG. 3 is a block diagram showing the data interfaces between function blocks of the programmable ASIC.
Figure 4:
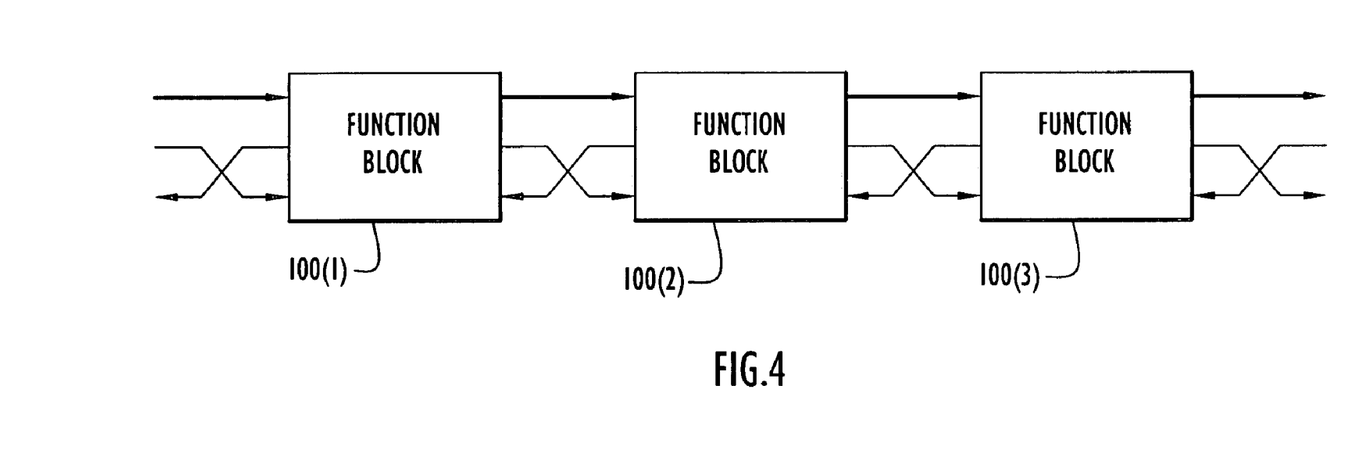
FIG. 4 is a block diagram showing how function blocks are connected together.
Figure 5A:
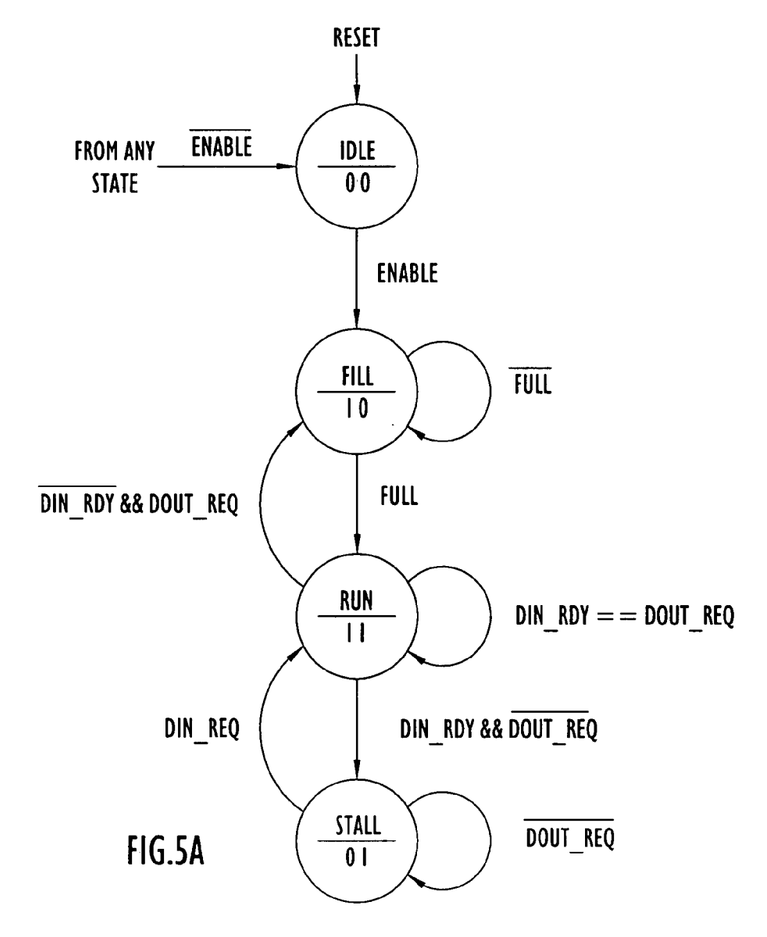
FIGS. 5A and 5B are diagrams illustrating the states of a function block associated with a common data interface rules that each of the function blocks follow.
Figure 5B:
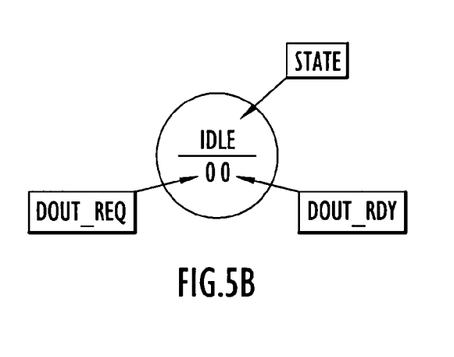

FIG. 3 shows the signals that make up the common interface, and FIG. 4 shows one example of how a set of function blocks are connected together. FIGS. 5A and 5B illustrate the various states associated with the status of a ready flag (REQ) and a request (RDY) flag. Each function block receives data input (DIN) and generates data output (DOUT).

| REQ | RDY | DESTINATION | SOURCE | ACTION |
| --- | --- | --- | --- | --- |
| 0 | 0 | The function is not ready to accept new data | Data is not available for transfer | No transfer of data |
| 0 | 1 | The function is not ready to accept new data | Data is ready for transfer | No transfer of data |

-continued

| REQ | RDY | DESTINATION | SOURCE | ACTION |
| --- | --- | --- | --- | --- |
| 1 | 0 | The function can accept new data | Data is not available for transfer | No transfer of data |
| 1 | 1 | The function can accept new data | Data is ready for transfer | Data is transferred |

A handshaking scheme is established according to the table set forth above for the DIN_REQ flag and DOUT_RDY flag of a function block, depending on an Enable signal, reset, DOUT_REQ flag of a destination function block and the DIN_RDY flag of a source function block. If a function block has room for more data within its pipeline, it sets its input request DIN_REQ flag. If a function block has output data available, it sets its output ready DOUT_RDY flag. If a function block wants output from another function block it sets an output request DOUT_REQ flag. If a function block has input data ready for another function block, it sets its input read DIN_RDY flag. Each function block is responsible for maintaining a full internal pipeline, and need not be concerned about the source and destination formats.

FIGS. 5A and 5B show that the interface flags DIN_REQ and DOUT_RDY of a function block occupy one of 4 states. The Idle state is when these flags are both not set, or are 00. The Fill state is when the DIN_REQ flag is set and the DOUT_RDY flag is not set, or are 10. The Run state is when both of these flags are set, or are 11. The Stall state is when the DIN_REQ flag is not set and the DOUT_RDY flag is set.

A function block enters the Idle state from any other state when it's Enable signal goes low, or is Reset. A transition is made from the Idle state to the Fill state when the Enable signal for the function block is high, indicating that the function block is can accept new data from a source function. As long as that function block's Full signal is low, the function block will stay in the Fill state. A transition is made from the Fill state to the Run state when the function block's Full signal goes high. In the Run state, the function block has data ready to transfer to a destination function block, and is ready to accept input data from a source function block. As long as the DIN_RDY flag of a source function block and the DOUT_REQ flag of a destination function block are the same, the function block will stay in the Run state. A transition is made from the Run State to the Fill state when the DIN_RDY of a source function block flag goes low and the DOUT_REQ flag of a destination function block goes high. A transition is made from the Run state to the Stall state when the DIN_RDY flag of a source function block goes high and the DOUT_REQ flag of a destination function block goes low. The function block stays in the Stall state as long as the DOUT_REQ flag of a destination function block is low, but transitions to the Run State when the DOUT_REQ flag goes high. Generally speak, a first fixed function block transfers data to a second fixed function block only when the output ready flag of the first fixed function block is set and the input request flag of the second fixed function block is set.

All data produced by the fixed and programmable function blocks may be considered real. Therefore, if a function block creates a complex output from a real input, it is considered to generate two ("real") output values. The function blocks that convert between real and complex data may have multiple input or output ports. The data interface between function blocks allows for arbitrary shifting, masking, etc., of data to allow for varying data formats and widths between blocks.

A standard method of handling dynamic control signals may be provided. Dynamic control signals are a way to flag "fields" of data that need to be processed differently that other data. A typical example is identifying synchronization fields that are embedded within a transmission/reception. These control inputs are sampled when data is being accepted. Any control outputs are valid as data is being transferred out.

Additional interface rules may be developed with further generations of the technology. However, interface rules are standardized across the function blocks.

When all fixed functions blocks are designed according to a set of common data interface rules, the data processing functions become separate and independent of the control functions that are required. This adds to the portability of all a fixed function block. Thus, a significant additional benefit of common data interface rules is that a library of standardize fixed functions can be created that can be used for many applications of the programmable ASIC.

Another significant benefit is that power consumption can be optimized by controlling the master clock rate (a significant contributor to power consumption). To optimize the power, the clock rate is programmed for each waveform or application the programmable ASIC is to support. A minimum clock rate that is necessary to process the data with all of the function blocks (which can be calculated) may be used.

The programmable control block 400 handles all signal processing control functions for the ASIC 10'. The FPGA that is used to implement the programmable control block 400 is re-programmed for each waveform that is to be processed and generates all control signals that are required for the associated signal processing functions. The programmable control block 400 also performs the sync detect and tap selection functions since these functions are usually waveform dependent.

Referring back to FIG. 2, each processing path has its own switch matrix that can be programmed to connect the data processing functions in any order. Each switch matrix has a primary input, a primary output, an external interface, and an intermediate interface that are routed to every data processing function within its data processing path. All inputs and outputs of each switch matrix also adhere to the common data interface.

The primary input is used to get the input data into the processing path. The primary output is used to get the output data out of the processing path. The external interface is similar to the intermediate interface, except that the signals may be re-timed and aligned to the output clock. The intermediate interface consists of an input port from each function block, as well as an output port to each function block. Each output port (including the primary output and external output port) is created by multiplexing all input ports (including the primary input and external input ports). The processing path is "programmed" by controlling the multiplexers in the switch matrices, thereby selecting the input port from each function block. If a function block is not to be used, the switch matrix "zero's" the data and RDY signals on its ports. Multiplexing a port implies multiplexing both the data and RDY signals, as well as the REQ signal that goes in the opposite direction.

Each independent TRANSEC block 120(1) to 120(4) may comprises multiple TRANSEC generators. The TRANSEC generators are connected via a small switch matrix to select a particular TRANSEC generator for each function that requires a TRANSEC input stream. TRANSEC generators can be any TRANSEC algorithm (i.e. Key Multiplier) or an input buffer that is loaded with pre-generated TRANSEC data. The programmable control block 300 contains multiple TRANSEC generator interfaces to provide each waveform the capability to implement any small TRANSEC functions that it requires.

Figure 6:
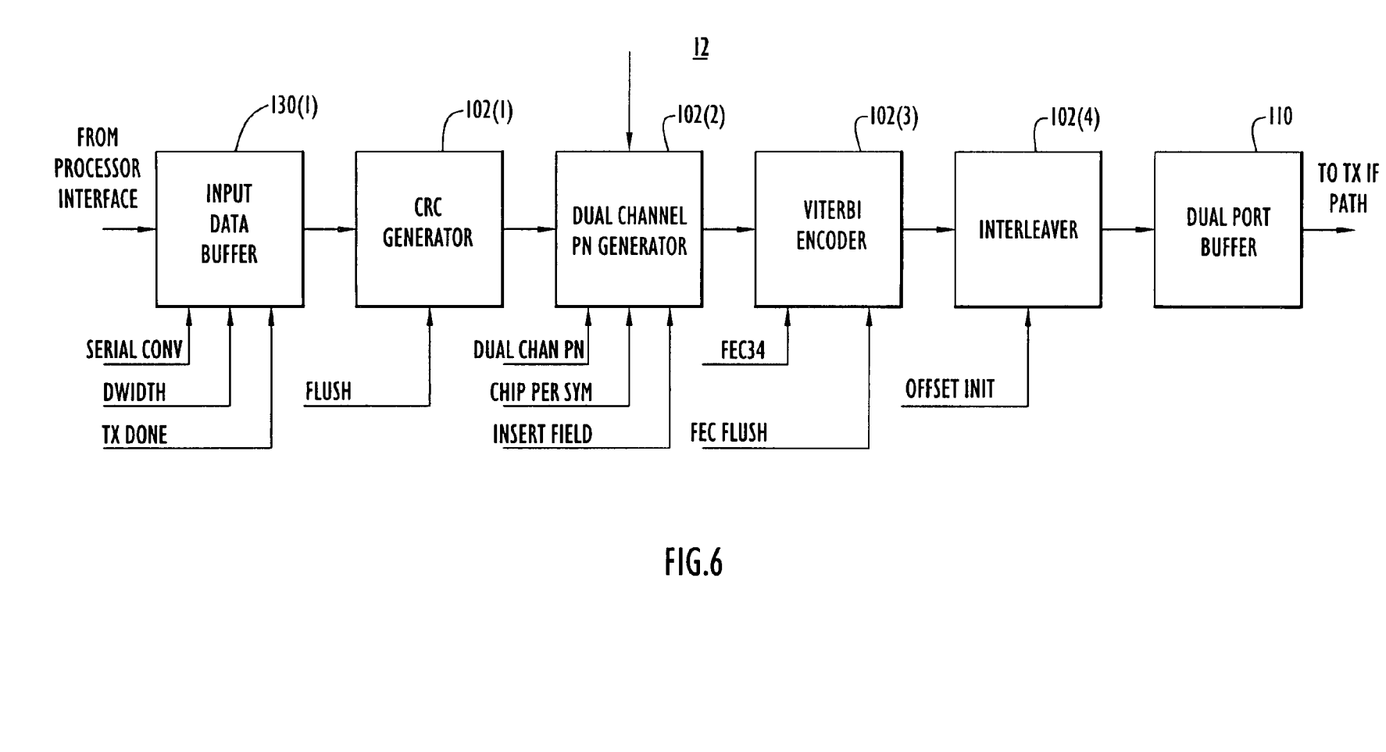
FIG. 6 is a functional block diagram of one exemplary processing path of the programmable ASIC shown in FIG. 2.

FIG. 6 illustrates in more detail the TX baseband processing path 12 to show how the fixed functions are combined with the programmable functions in a radio communication application. In this path, there are, for example, the input data buffer block 130(1), a CRC generator block 102(1), a dual channel pseudo-random noise (PN) generator block 102(2), a Viterbi encoder block 102(3), an interleaver block 102(4) and the dual port buffer 110. This is only an example of functions that may be required in an exemplary TX baseband path, and to show how the various function blocks are connected together.

Each of the blocks 102(1), 102(2), 102(3) and 102(4) are fixed function blocks implemented by fixed digital logic. However, these function blocks are parameterized as explained above so that their functions can be modified for a particular waveform. These parameters are shown as labeled arrows into the bottom of each function block. The programmable switch logic 300(1) links the function blocks 102(1), 102(2), 102(3) and 102(4), represented by the arrows between the function blocks shown in FIG. 5.

The input data buffer 130(1) is loaded by a parallel interface that has been synchronized to the TX baseband clock domain. A processor or DSP is the source of the data, but an external processor interface may collect the data (either serial or parallel), and transfer it across the parallel interface to the input data buffer 130(1). Examples for parameters for the input data buffer 130(1) are SERIAL CONV, DWIDTH and TX DONE, described below.

The DWIDTH parameter specifies the number of valid data bits in the input word. This allows input data to be of any width between 1 and 16 bits, for example. When SERIAL CONV is asserted, the input data buffer converts the DWIDTH bits into a serial data stream. This data stream may be sent out with the least significant output bit first. When SERIAL CONV is not asserted, the input data buffer 130(1) outputs all DWIDTH bits of the input word according to the common data interface. Another control parameter for the input data buffer 130(1) is a write input (WR) that is a dynamic input used to enable (logic 1) writing the parallel input words into the input data buffer 130(1).

Since each data function has a fixed width input, the programmable switch logic 300(1) knows the width of each of its outputs. Therefore, the programmable switch logic 300(1) truncates bits, knowing that the data is always LSB justified, for example.

To end a transmission, the programmable control block 400 resets the input data buffer 130(1) by asserting the TX DONE input for at least one clock cycle, thereby clearing away any data that is not to be transmitted. Asserting the TX DONE input causes the output data interface of the input data buffer 130(1) to stop transmitting data.

The CRC generator block 102(1) has one control parameter called FLUSH. FLUSH is a dynamic input that determines whether the CRC generator block 102(1) should be accepting data and computing the CRC value (logic 0), or if it should be outputting the CRC value (logic 1). This is asserted on the clock cycle that the last data bit is input and de-asserted on the clock cycle that the last bit of the CRC value is output.

The CRC generator block 102(1) accepts a single bit input stream and provides a single bit output stream. When the FLUSH signal is asserted, the CRC generator block 102(1) stops accepting input data, and provides the inverted CRC value at its output. Once the CRC value has been sent out, the CRC generator block de-asserts its RDY signal.

The dual channel PN generator 102(2) has the following control parameters: DUAL CHAN PN, CHIP PER SYM and INSERT FIELD.

DUAL CHAN PN is a static input that selects whether the PN generator 102(2) is operating on both input channels (logic 1) or a single data channel (logic 0). CHIP PER SYM is a static input value that specifies the number of chips per symbol. ZERO FIELD is a dynamic input that selects when a zero-data field is inserted into the spread output. This is asserted on the clock cycle that the last data bit is input, or on any clock cycle that a zero-data field is needed, and de-asserted on the clock cycle that the last bit of the zero-data field is output. The zero-data field may not be required to adhere to symbol boundaries.

The dual channel PN generator block 102(2) performs an exclusive-OR operation of up to two data streams with a single PN sequence. When the DUAL control input is asserted (dual channel mode), the dual channel PN generator block 102(2) collects data words on both input ports. It also requests the PN data that is used to spread the data. The CHIP PER SYM parameter specifies the number of PN bits (chips) that need to be requested for each data word (symbol). The result on each output port is the exclusive-OR of the corresponding data stream and the PN chip stream. When the DUAL control input is not asserted (single channel mode), the dual channel PN generator block 102(2) only requests data on the I INPUT port, and provides an output on the I OUTPUT port. The data processing is the same as described above. The ZERO FIELD control input stalls the input data interfaces until the entire zero-data field is generated and output. The dual channel PN generator block 102(2) has dual channel capability in order to satisfy waveforms in which two data streams need to be spread with the same PN sequence, i.e., in-phase (I) and quadrature-phase (Q) signal processing. This eliminates the need to replicate TRANSEC generators.

The control parameters for the Viterbi encoder block 102(3) are FEC34 and FEC FLUSH. FEC34 is a static input that controls the FEC encoding rate. When FEC34 is a logic 0, Rate ½ encoding is performed. When FEC34 is a logic 1, Rate ¾ is performed. FLUSH is a dynamic input that determines whether the Viterbi encoder block 102(3) should be accepting external data (logic 0), or if it should be flushing with zero'd data (logic 1). This is asserted on the clock cycle that the last data bit is input and de-asserted on the clock cycle that the last flush bit is output. The function of a Viterbi encoder is well known in the art.

The control parameter for the interleaver block 102(4) is OFFSET INIT. OFFSET INIT is an input that is used as the initial value for the interleaver offset LSG. This value is a TRANSEC based value that is expected to change for each transmission. Setting this value to zero results in standard block interleaving. The function of an interleaver 102(4) is well known in the art.

The dual port buffer 110 that is shared by the TX baseband processing path 12 and the TX IF processing path 14 may be a FIFO memory block. All data that is written into the TX baseband port of the buffer 110 is read out of the TX IF port, processed by the TX IF path and eventually transmitted.

Figure 7:
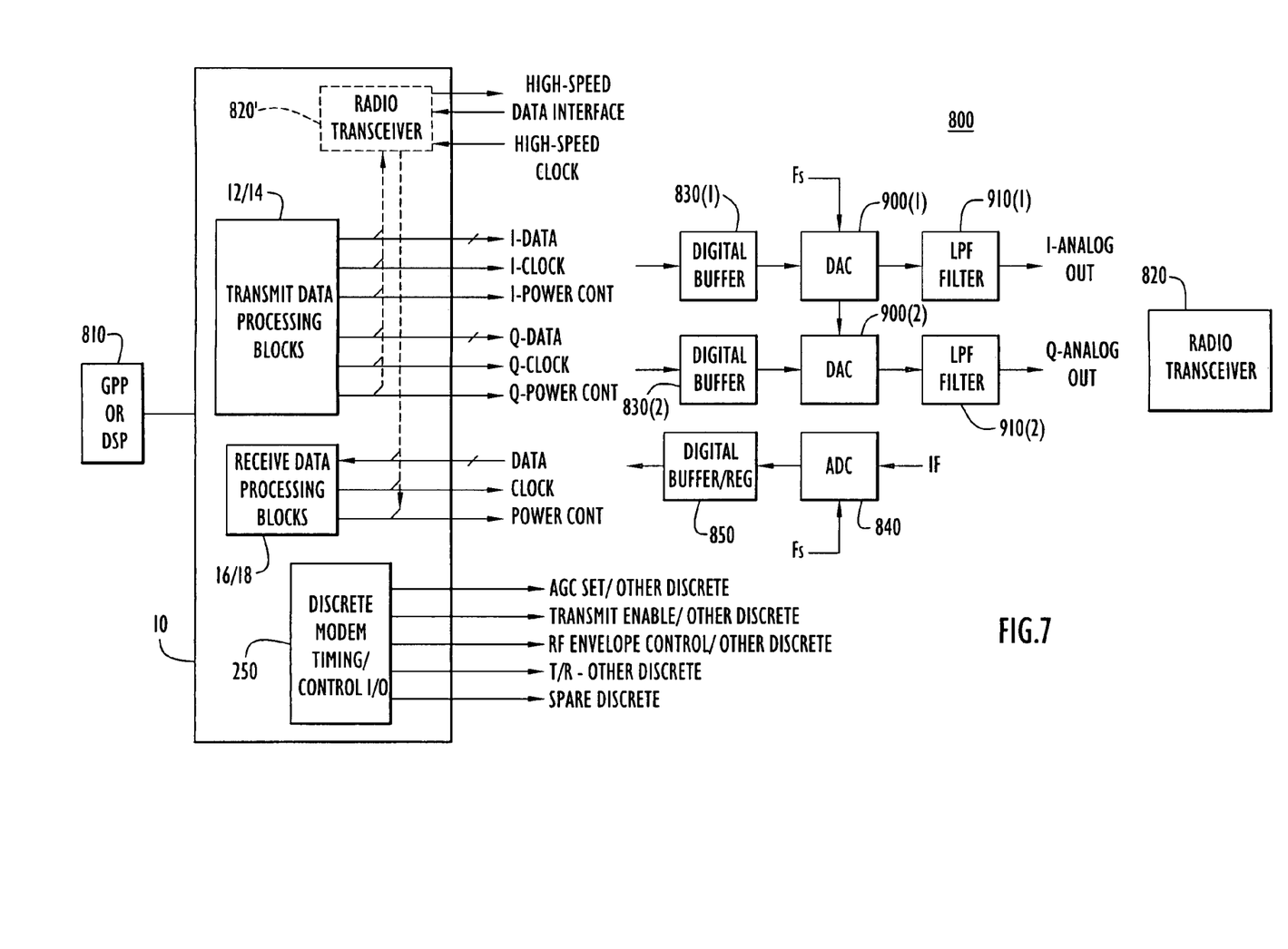
FIG. 7 is a block diagram showing how the programmable ASIC of FIG. 2 may interface to a radio transceiver.

Turning to FIG. 7, an exemplary use of the programmable ASIC 10' in a communication device will be described. The communication device 800 comprises a general purpose processor (GPP) or DSP 810 and a radio transceiver 820. The programmable ASIC 10' connects to the GPP or DSP 810 via a suitable interface. In the programmable ASIC 10' there is also a discrete modem timing/control I/O block 250 that supplies a set of signals shown in the diagram.

The output of the transmit data processing blocks 12 and 14 of the programmable ASIC may consist of I-Data, I-Clock, I-Power Control for the in-phase signal, and Q-Data, Q-Clock and Q-Power Control for the quadrature phase signal. The in-phase related signals are coupled to separate digital buffer/DAC paths formed by digital buffer 830(1) and DAC 900(1) and digital buffer 830(2) and DAC 900(2), respectively. The outputs of each of these paths are coupled to respective low pass filter (LPFs) 910(1) and 910(2) before I-Analog and Q-Analog signals are coupled to the radio transceiver 820 for transmit processing.

Similarly, in the receive path, a received IF signal output by the radio transceiver 820 is coupled to an ADC 840 and then to a digital buffer 850 where the digital receive data is then coupled to the receive data processing blocks 16 and 18 in the programmable ASIC 10'.

As an alternative, the functions of the radio transceiver 820 may be implemented in the programmable ASIC 10' using a combination of fixed functions and programmable functions. This is represented by reference numeral 820'. In this case, the output of the transmit data processing blocks 12/14 are coupled to the radio transceiver 820' in the programmable ASIC and the output of the radio transceiver 820' is coupled to the receive data processing blocks 16/18 in the programmable ASIC 10'. The transmit outputs of the radio transceiver 820' may be coupled via a high-speed data interface to the LPFs 910(1) and 910(2). In this configuration, the programmable ASIC 10' may perform both baseband and radio frequency (RF) processing functions. The only blocks not on the programmable ASIC are the data converters (ADCs and DACs) and filters required to interface the programmable ASIC 10' to one or more transmit and receive antenna(s).

Figure 8:
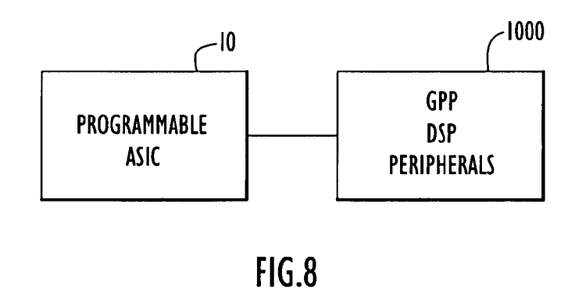
FIGS. 8 and 9 are diagrams showing various deployment options for the programmable ASIC described herein.
Figure 9:
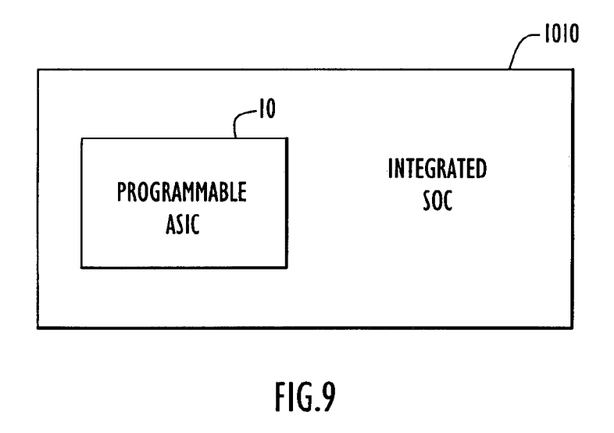

Turning to FIGS. 8 and 9, the programmable ASIC 10 (or 10') may be deployed in a variety of ways. FIG. 7 shows the ASIC 10 connected to a GPP, DSP and/or other peripheral devices collectively shown at reference numeral 1000. These external devices may be implemented as discrete components, or they may be implemented on a single IC, referred to as a system-on-chip (SoC). FIG. 9 shows the ASIC 10 integrated as part of a larger SoC on which the other functions, e.g., GPP, DSP, etc., are also implemented thereby forming one ASIC chip 1010.

To summarize, a programmable ASIC is provided for implementing operations that involve a plurality of computational functions. The programmable ASIC comprises a plurality of fixed functions each of which is parameterized such that its operational characteristics are programmable using different operating parameters, wherein each of the plurality of fixed functions inputs and outputs data in accordance with common interface rules; and programmable switch logic that is configurable to link two or more of the fixed functions in a sequence to perform desired operations. Each of the fixed functions is parameterized such that its operational characteristics are programmable using different parameters for one or more of a plurality of waveforms, and the programmable switch logic is configurable to link the two or more of the fixed functions to perform signal processing of one or more of the plurality of waveforms.

Furthermore, a programmable ASIC is provided for implementing operations pertaining to communication applications. The programmable ASIC comprises fixed digital logic that performs a plurality of fixed functions, each fixed function being parameterized such that operational characteristics of each fixed function are programmable using different operating parameters for one or more of a plurality of waveforms, wherein each of the plurality of fixed functions inputs and outputs data in accordance with common interface rules; and digital logic implementing a switch matrix that is configurable to link two or more of the fixed functions in a sequence to perform signal processing of one or more of the plurality of waveforms.

Further, a programmable ASIC is provided for implementing operations pertaining to communication applications. The programmable ASIC comprises fixed digital logic that performs a plurality of fixed functions, each fixed function being parameterized such that operational characteristics of each fixed function are programmable using different operating parameters for one or more of a plurality of waveforms; programmable digital logic to perform a plurality of functions for one or more of the plurality of waveforms; and digital logic implementing a switch matrix that is configurable to link the fixed digital logic and the programmable digital logic to perform signal processing of one or more of the plurality of waveforms.

Further still, a method is provided for performing data processing comprising: performing with fixed digital logic a plurality of fixed computational functions each using configurable parameters to achieve desired operational characteristics for each fixed computational function; outputting data from each fixed computational function and inputting data to each fixed computational function according to common interface rules; linking the fixed computational functions to achieve a desired computation operation.

Still further, a programmable application specific integrated circuit (ASIC) for implementing operations that involve a plurality of computational functions, comprising: at least one fixed function that is parameterized such that operational characteristics of the fixed function are programmable using different operating parameters; at least one programmable function; and programmable switch logic that is configurable to link the at least one fixed function and the at least one programmable function to perform desired operations.

The system and methods described herein may be embodied in other specific forms without departing from the spirit or essential characteristics thereof. The foregoing embodiments are therefore to be considered in all respects illustrative and not meant to be limiting.

What is claimed is:

1. A programmable application specific integrated circuit (ASIC) for implementing operations that involve a plurality of computational functions, comprising:
    a. a plurality of fixed functions each of which is parameterized such that its operational characteristics are programmable using different operating parameters, wherein each of the plurality of fixed functions inputs and outputs data in accordance with common interface rules and such that its data processing functions and control functions are separated; and
    b. programmable switch logic that is configurable to link two or more of the fixed functions in a sequence to perform desired operations.

2. The programmable ASIC of claim 1, wherein the programmable switch logic passes data between the plurality of fixed functions according to the common interface rules thereby allowing linking of the fixed functions in any order.

3. The programmable ASIC of claim 1, wherein each of the plurality of fixed functions requests input data from other fixed function blocks and outputs data to other function blocks as fast as it can according to the common interface rules.

4. A programmable application specific integrated circuit (ASIC) for implementing operations that involve a plurality of computational functions, comprising:
    a. a plurality of fixed functions each of which is parameterized such that its operational characteristics are programmable using different operating parameters, wherein each of the plurality of fixed functions automatically adjusts to any data rate, inputs and outputs data in accordance with common interface rules, requests input data from other fixed functions and outputs data to other fixed functions as fast as it can according to the common interface rules; and
    b. programmable switch logic that is configurable to link two or more of the fixed functions in a sequence to perform desired operations.

5. The programmable ASIC of claim 4, wherein each of the plurality of fixed functions requests input data and outputs data such that its data processing functions and control functions are separated.

6. A programmable application specific integrated circuit (ASIC) for implementing operations that involve a plurality of computational functions, comprising:
    a. a plurality of fixed functions each of which is parameterized such that its operational characteristics are programmable using different operating parameters, wherein each of the plurality of fixed functions inputs and outputs data in accordance with common interface rules, wherein each of the plurality of fixed functions executes the common interface rules and generates an input request flag that indicates whether the fixed function is ready to accept data, and an output ready flag that indicates whether the fixed function has data ready for transfer to another fixed function; and
    b. programmable switch logic that is configurable to link two or more of the fixed functions in a sequence to perform desired operations.

7. The programmable ASIC of claim 6, wherein each of the plurality of fixed functions executes the common interface rules to transition between a plurality of states associated with the input request flag and the output ready flag.

8. The programmable ASIC of claim 7, wherein a first fixed function transfers data to a second fixed function only when the output ready flag of the first fixed function is set and the input request flag of the second fixed function is set.

9. The programmable ASIC of claim 1, wherein the at least one fixed function is implemented by fixed digital logic.

10. The programmable ASIC of claim 1, and further comprising at least one programmable function, wherein the programmable switch logic is configurable to link two or more of the fixed functions with the at least one programmable function.

11. The programmable ASIC of claim 10, wherein the at least one programmable function is implemented by programmable digital logic.

12. The programmable ASIC of claim 1, wherein the programmable switch logic comprises a switch matrix.

13. A programmable application specific integrated circuit (ASIC) for implementing operations that involve a plurality of computational functions, comprising:
    a. a plurality of fixed functions each of which is parameterized such that its operational characteristics are programmable using different operating parameters, wherein each of the plurality of fixed functions inputs and outputs data in accordance with common interface rules;
    b. programmable switch logic that is configurable to link two or more of the fixed functions in a sequence to perform desired operations; and
    c. a programmable control block that performs real-time control of the at least one fixed function and at least one programmable function.

14. A programmable application specific integrated circuit (ASIC) for implementing operations that involve a plurality of computational functions, comprising:
    a. a plurality of fixed functions each of which is parameterized such that its operational characteristics are programmable using different operating parameters for one or more of a plurality of waveforms, wherein each of the plurality of fixed functions inputs and outputs data in accordance with common interface rules;

b. programmable switch logic that is configurable to link two or more of the fixed functions in a sequence to perform desired operations, the programmable switch logic being configurable to link the two or more of the fixed functions to perform signal processing of one or more of the plurality of waveforms.

15. The programmable ASIC of claim 14, and further comprising a plurality of programmable functions, wherein the programmable switch logic links two or more of the plurality of fixed functions with two or more of the plurality of programmable functions to perform signal processing of one or more of the plurality of waveforms.

16. In combination, the programmable ASIC of claim 15 and a radio transceiver connected to the programmable ASIC.

17. The combination of claim 16, and further comprising a general purpose processor connected to the programmable ASIC.

18. An integrated circuit system on chip device comprising the programmable ASIC of claim 15, and further comprising general purpose processor functions implemented thereon.

19. A software defined radio device comprising the programmable ASIC of claim 14.

20. The programmable ASIC of claim 1, wherein the fixed functions are programmable with different operating parameters to perform with corresponding different operational characteristics.

21. A programmable application specific integrated circuit (ASIC) for implementing operations pertaining to communication applications, comprising:
   a. fixed digital logic that performs a plurality of fixed functions, each fixed function being parameterized such that operational characteristics of each fixed function are programmable using different operating parameters for one or more of a plurality of waveforms, wherein each of the plurality of fixed functions inputs and outputs data in accordance with common interface rules;
   b. digital logic implementing a switch matrix that is configurable to link two or more of the fixed functions in a sequence to perform signal processing of one or more of the plurality of waveforms; and
   c. programmable digital logic to perform a plurality of functions for one or more of the plurality of waveforms.

22. The programmable ASIC of claim 21, wherein the fixed digital logic is programmable with different operating parameters to perform with corresponding different operational characteristics for each of the plurality of waveforms.

23. A programmable application specific integrated circuit (ASIC) for implementing operations pertaining to communication applications, comprising:
   a. fixed digital logic that performs a plurality of fixed functions, each fixed function being parameterized such that operational characteristics of each fixed function are programmable using different operating parameters for one or more of a plurality of waveforms, wherein each of the plurality of fixed functions inputs and outputs data in accordance with common interface rules:
   b. digital logic implementing a switch matrix that is configurable to link two or more of the fixed functions in a sequence to perform signal processing of one or more of the plurality of waveforms; and
   c. programmable digital logic for performing real-time control of the fixed digital logic and programmable digital logic.

24. The programmable ASIC of claim 21, wherein the programmable switch logic links the fixed functions in the fixed digital logic to perform transmit processing in a transmit processing path and receive processing in a receive processing path.

25. The programmable ASIC of claim 21, wherein said programmable digital logic performs a plurality of functions for one or more of the plurality of waveforms.

26. The programmable ASIC of claim 21, wherein the programmable switch logic links the fixed functions in the fixed digital logic to perform transmit baseband processing in a transmit baseband processing path, transmit intermediate frequency (IF) processing in a transmit IF processing path, receive IF processing in a receive IF processing path and receive baseband processing in a receive baseband processing path.

27. The programmable ASIC of claim 21, wherein the switch matrix passes data between the plurality of fixed functions according to the common interface rules thereby allowing linking of the fixed functions in any order.

28. The programmable ASIC of claim 21, wherein each of the plurality of fixed functions requests input data from other fixed functions and outputs data to other functions as fast as it can according to the common interface rules.

29. The programmable ASIC of claim 28, wherein each of the plurality of fixed functions automatically adjusts to any data rate.

30. The programmable ASIC of claim 21, wherein each of the plurality of fixed functions requests input data and outputs data such that its data processing functions and control functions are separated.

31. The programmable ASIC of claim 21, wherein each of the plurality of fixed functions executes the common interface rules and generates an input request flag that indicates whether the fixed function is ready to accept data, and an output ready flag that indicates whether the fixed function has data ready for transfer to another fixed function.

32. The programmable ASIC of claim 31, wherein each of the plurality of fixed functions executes the common interface rules to transition between a plurality of states associated with the input request flag and the output ready flag.

33. The programmable ASIC of claim 32, wherein a first fixed function transfers data to a second fixed function only when the output ready flag of the first fixed function is set and the input request flag of the second fixed function is set.

34. A software defined radio device comprising the programmable ASIC of claim 21.

35. A method for performing data processing comprising:
   a. performing with fixed digital logic a plurality of fixed computational functions each with configurable parameters such that its operational characteristics are programmable using different parameters for one or more of a plurality of waveforms;
   b. outputting data from each fixed computational function and inputting data to each fixed computational function according to common interface rules;
   c. linking with programmable switch logic the fixed computational functions to perform signal processing of one or more of the plurality of waveforms.

* * * * *